United States Patent
Yamamoto et al.

(10) Patent No.: US 10,491,180 B2
(45) Date of Patent: Nov. 26, 2019

(54) BOARD-TYPE NOISE FILTER AND ELECTRONIC DEVICE

(71) Applicant: Mitsubishi Electric Corporation, Chiyoda-ku, Tokyo (JP)

(72) Inventors: Kazuya Yamamoto, Tokyo (JP); Takashi Kumagai, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 51 days.

(21) Appl. No.: 15/562,574

(22) PCT Filed: Apr. 27, 2016

(86) PCT No.: PCT/JP2016/063174
§ 371 (c)(1),
(2) Date: Sep. 28, 2017

(87) PCT Pub. No.: WO2016/181835
PCT Pub. Date: Nov. 17, 2016

(65) Prior Publication Data
US 2018/0115293 A1   Apr. 26, 2018

(30) Foreign Application Priority Data

May 14, 2015 (JP) .................................. 2015-099193

(51) Int. Cl.
*H03H 7/01* (2006.01)
*H03H 7/09* (2006.01)
(Continued)

(52) U.S. Cl.
CPC ......... *H03H 1/0007* (2013.01); *H01F 17/062* (2013.01); *H01F 27/2823* (2013.01);
(Continued)

(58) Field of Classification Search
CPC ................. H03H 7/0115; H03H 7/427; H03H 2001/0085; H03H 7/09; H01F 2027/065
(Continued)

(56) References Cited

FOREIGN PATENT DOCUMENTS

| JP | 58-72825 | 5/1983 |
|---|---|---|
| JP | S62-161208 A | 7/1987 |

(Continued)

OTHER PUBLICATIONS

English translation of JP2002-252535 (Year: 2002).*
(Continued)

*Primary Examiner* — Rakesh B Patel
(74) *Attorney, Agent, or Firm* — Buchanan Ingersoll & Rooney PC (57) ABSTRACT

A board-type noise filter having higher noise removal performance than that of a conventional noise filter, and an electronic device including the board-type noise filter are provided. The board-type noise filter includes: a printed wiring board having a wiring pattern formed thereon; a choke coil including a core having a toroidal shape; a frame ground portion fixed to the printed wiring board at a position overlapping with a hollow portion of the choke coil when the toroidal shape of the choke coil is seen in plan view, the frame ground portion being capable of being grounded to a frame ground; and a capacitor having a first terminal connected to the frame ground portion through the wiring pattern.

5 Claims, 4 Drawing Sheets

(51) Int. Cl.
| | |
|---|---|
| *H03H 1/00* | (2006.01) |
| *H01F 27/28* | (2006.01) |
| *H05K 1/02* | (2006.01) |
| *H05K 1/18* | (2006.01) |
| *H03H 7/42* | (2006.01) |
| *H01F 17/06* | (2006.01) |
| *H01F 27/29* | (2006.01) |
| *H01F 27/06* | (2006.01) |
| *H01F 17/00* | (2006.01) |

(52) U.S. Cl.
CPC ............ *H01F 27/292* (2013.01); *H03H 7/09* (2013.01); *H03H 7/427* (2013.01); *H05K 1/0216* (2013.01); *H05K 1/181* (2013.01); *H01F 2017/0093* (2013.01); *H01F 2027/065* (2013.01); *H03H 2001/005* (2013.01); *H03H 2001/0035* (2013.01); *H05K 2201/1003* (2013.01); *H05K 2201/10015* (2013.01)

(58) Field of Classification Search
USPC .................................................. 333/181, 185
See application file for complete search history.

(56) References Cited

FOREIGN PATENT DOCUMENTS

| | | | |
|---|---|---|---|
| JP | 4-154204 | A | 5/1992 |
| JP | 5-6820 | U | 1/1993 |
| JP | 7-36468 | U | 7/1995 |
| JP | 2002-252535 | A | 9/2002 |
| JP | 2010-165795 | A | 7/2010 |
| JP | 2011-205211 | A | 10/2011 |
| JP | 2013-68514 | A | 4/2013 |
| JP | 2014-217244 | A | 11/2014 |

OTHER PUBLICATIONS

International Search Report (PCT/ISA/210) dated Jul. 12, 2016, by the Japanese Patent Office as the International Searching Authority for International Application No. PCT/JP2016/063174.

Written Opinion (PCT/ISA/237) dated Jul. 12, 2016, by the Japanese Patent Office as the International Searching Authority for International Application No. PCT/JP2016/063174.

Office Action (Notification of Reasons for Refusal) dated Aug. 28, 2018, by the Japanese Patent Office in corresponding Japanese Patent Application No. 2017-517877 and English translation of the Office Action. (7 pages).

German Office Action dated Jan. 28, 2019, by the German Patent and Trademark Office in corresponding German Patent Application No. 11 2016 002 174.7, with English translation. (11 pages).

* cited by examiner

BOARD-TYPE NOISE FILTER AND ELECTRONIC DEVICE

TECHNICAL FIELD

The present invention relates to a board-type noise filter having a toroidal-shaped choke coil mounted on a printed wiring board, and an electronic device including the board-type noise filter.

BACKGROUND ART

A printed wiring board having an electric circuit that involves hard switching at an inverter, a switching power supply or the like is equipped with a noise filter for suppressing electromagnetic noise. In a noise filter for suppressing common mode noise, for example, a common mode choke coil serving as an inductor in a common mode is mounted on a printed wiring board similarly to filter circuit elements such as a bypass capacitor.

Japanese Utility Model Laying-Open No. 5-006820 (PTD 1) describes a board-type noise filter having a common mode choke coil mounted on an insulating stand with four corner legs, where the insulating stand is mounted on a wiring board. Filter circuit elements such as a capacitor except for the common mode choke coil, and external connection terminals are directly mounted on the wiring board.

In a noise filter for suppressing normal mode noise, a normal mode choke coil serving as an inductor in a normal mode is mounted on a printed wiring board similarly to filter circuit elements such as a bypass capacitor.

CITATION LIST

Patent Document

PTD 1: Japanese Utility Model Laying-Open No. 5-006820

SUMMARY OF INVENTION

Technical Problem

In the board-type noise filter described in the above PTD 1, however, a terminal stand into which the external connection terminals connected to a frame ground are inserted and fitted is spaced from the capacitor, thus requiring a wiring pattern connecting them together to be formed on the wiring board. Such a configuration, whether it includes a common mode choke coil or a normal mode choke coil, has a disadvantage of reduced noise removal performance of the noise filter due to an inductance component of wiring.

The present invention has been made to solve the aforementioned problem. A main object of the present invention is to provide a board-type noise filter having higher noise removal performance than that of a conventional noise filter, and an electronic device including the board-type noise filter.

Solution to Problem

A board-type noise filter according to the present invention includes: a printed wiring board having a wiring pattern formed thereon; a common mode choke coil mounted on the printed wiring board, and including a core having a toroidal shape and a coil wound around the core; a frame ground portion fixed to the printed wiring board at a position overlapping with a hollow portion of the common mode choke coil when the toroidal shape of the common mode choke coil is seen in plan view, the frame ground portion being provided such that it can be grounded to a frame ground; and a line bypass capacitor mounted on the printed wiring board and having a first terminal and a second terminal, the first terminal being connected to the frame ground portion through the wiring pattern.

Advantageous Effects of Invention

According to the present invention, a board-type noise filter having higher noise removal performance than that of a conventional noise filter can be provided.

DESCRIPTION OF EMBODIMENTS

Embodiments of the present invention will be described below with reference to the drawings. The same or corresponding parts are designated by the same reference numerals in the following drawings, and description thereof will not be repeated.

(First Embodiment)

With reference to FIGS. 1 to 4, a board-type noise filter 100 and an electronic device 200 according to a first embodiment are described. Board-type noise filter 100 includes a printed wiring board 1, line bypass capacitors 2, 3, 8, 9, a common mode choke coil 4, and a frame ground portion 6. Line bypass capacitors 2, 3, 8, 9, common mode choke coil 4 and frame ground portion 6 are mounted on printed wiring board 1 and form a filter circuit.

Figure 1:
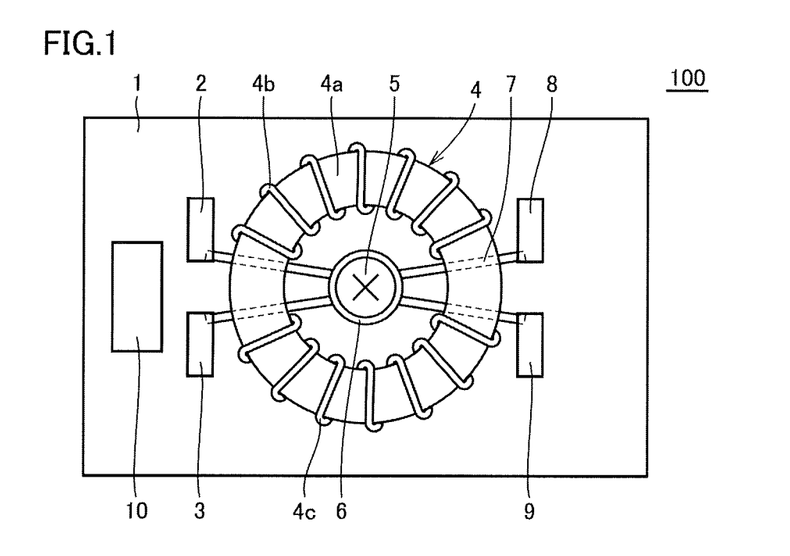
FIG. 1 is a top view for illustrating a board-type noise filter according to a first embodiment.

Printed wiring board 1 is formed with through holes into which both terminals (a first terminal and a second terminal) of each of line bypass capacitors 2, 3, 8, 9 are to be inserted, and a first through hole into which a fixing member 5 can be inserted. The first through hole into which fixing member 5 is to be inserted is formed on printed wiring board 1 at a position overlapping with a hollow portion of common mode choke coil 4 which will be described later.

Line bypass capacitors 2, 3, 8, 9 each have the first terminal and the second terminal connected to two electrodes, respectively, which are formed with a dielectric interposed therebetween. Line bypass capacitors 2, 3, 8, 9 are arranged around common mode choke coil 4 on printed wiring board 1.

Common mode choke coil 4 includes a core 4a having a toroidal shape, and two choke coils 4b, 4c wound around core 4a in opposite directions to each other. A material forming core 4a is ferrite, for example. Common mode choke coil 4 is configured such that, when a common mode current flows through two choke coils 4b and 4c, magnetic fluxes generated in core 4a are added together to provide high inductance.

Frame ground portion 6 is provided on printed wiring board 1 at a position overlapping with the hollow portion of common mode choke coil 4. A conductive pattern (not shown) made of a conductive material (for example, copper (Cu)) is formed at least on a surface of frame ground portion 6. Frame ground portion 6 is formed with a second through hole into which fixing member 5 can be inserted. The first through hole formed in printed wiring board 1 into which fixing member 5 is to be inserted and the second through hole formed in frame ground portion 6 into which fixing member 5 is to be inserted are formed such that they are communicated with each other in a thickness direction of printed wiring board 1.

A wiring pattern 7 is formed on printed wiring board 1. Wiring pattern 7 connects frame ground portion 6 to one terminal (first terminal) of each of line bypass capacitors 2, 3, 8, 9. Since frame ground portion 6 is arranged at the hollow portion of common mode choke coil 4 as described above, the length of wiring pattern 7 may be equal to or smaller than the diameter of common mode choke coil 4, for example. The width of wiring pattern 7 is preferably wide from the viewpoint of reducing wiring inductance. Wiring pattern 7 may be made of any conductive material, for example, Cu. Wiring pattern 7 may be formed with any method.

Figure 2:
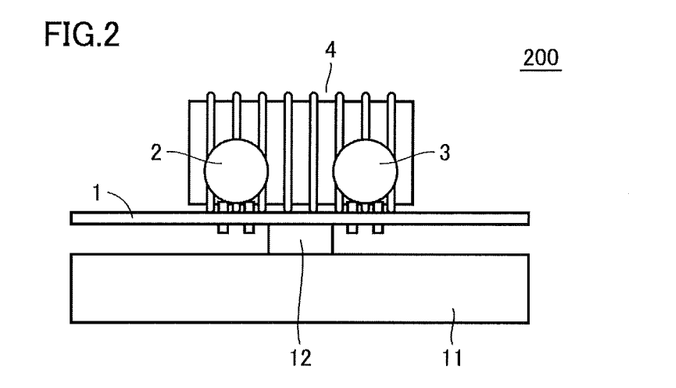
FIG. 2 is a partial side view for illustrating an electronic device including the board-type noise filter according to the first embodiment.
Figure 3:
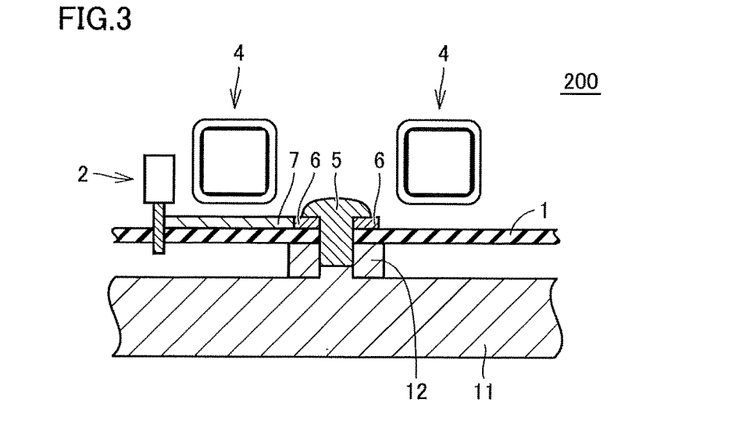
FIG. 3 is a partial cross-sectional view for illustrating the electronic device including the board-type noise filter according to the first embodiment.

As shown in FIGS. 2 and 3, electronic device 200 includes board-type noise filter 100 as described above, and a housing 11. Housing 11 may have any configuration as long as board-type noise filter 100 can be fixed thereto, and includes a support strut 12, for example. Housing 11 and support strut 12 are made of any conductive material. Support strut 12 is formed with a third through hole into which fixing member 5 can be inserted. Printed wiring board 1 and housing 11 are fixed to each other by inserting and tightening fixing member 5 into the first through hole, the second through hole and the third through hole described above. At least a surface of fixing member 5 is made of any conductive material. Fixing member 5 may have any configuration as long as it can fix printed wiring board 1 and housing 11 to each other, and is a screw, for example. Fixing member 5 has a portion (for example, a head of the screw) projecting toward common mode choke coil 4 relative to frame ground portion 6. Fixing member 5 is provided such that, when fixed to printed wiring board 1, it is spaced from choke coils 4b and 4c of common mode choke coil 4 by a distance equal to or greater than an insulating distance determined by the standard. Consequently, between choke coils 4b, 4c of common mode choke coil 4 and fixing member 5 (or frame ground portion 6), a parasitic capacitance (dielectric constant×area/distance between conductors) inversely proportional to the distance between them (distance between conductors) is formed.

By inserting and tightening fixing member 5 into the first through hole, the second through hole and the third through hole described above, frame ground portion 6 is electrically connected to housing 11 with fixing member 5 interposed therebetween, and is thereby grounded to a frame ground. Fixing member 5 fixes printed wiring board 1 to housing 11, and also electrically connects frame ground portion 6 to housing 11.

Figure 4:
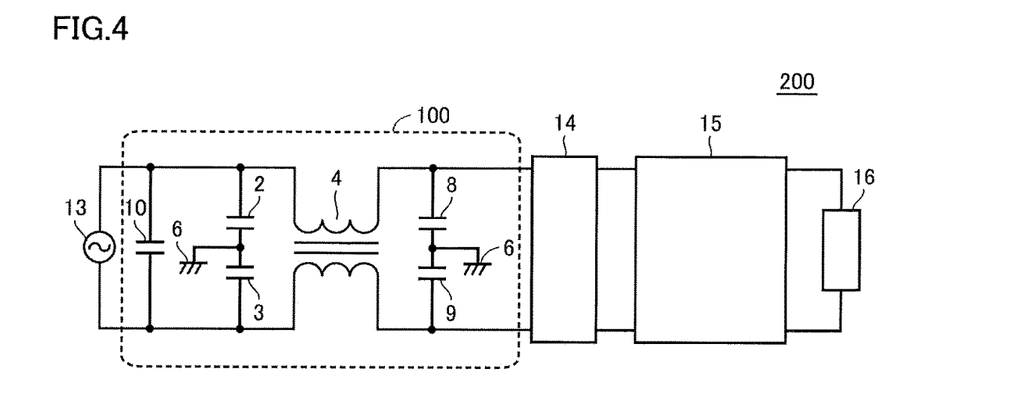
FIG. 4 is a circuit diagram of the electronic device including the board-type noise filter according to the first embodiment.

As shown in FIG. 4, electronic device 200 is configured as a switching power supply, for example, and in this case, further includes an external power supply 13, a rectifying diode bridge 14, a switching power supply circuit 15, and a load 16. As shown in FIG. 4, board-type noise filter 100 forms a filter circuit that connects external power supply 13 and rectifying diode bridge 14 in electronic device 200. Two input terminals of the above-described filter circuit (a first input terminal and a second input terminal; not shown) which are provided such that they can be connected to external power supply 13 are formed on printed wiring board 1. The first input terminal and the second input terminal are connected to one ends (starts of the windings) of the two choke coils forming common mode choke coil 4, respectively. The first input terminal and the second input terminal are connected to one terminals (second terminals) of line bypass capacitors 2 and 3, respectively. A capacitor (across-the-line-capacitor) 10 is connected between the first input terminal and the second input terminal. Two output terminals of the above-described filter circuit (a first output terminal and a second output terminal; not shown) are formed, for example, on printed wiring board 1. The other ends (ends of the windings) of the two choke coils forming common mode choke coil 4 are connected to the first output terminal and the second output terminal, respectively. The first output terminal and the second output terminal are connected to one terminals (second terminals) of line bypass capacitors 8 and 9, respectively. The other terminals (first terminals) of line bypass capacitors 2, 3, 8, 9 are connected to frame ground portion 6 through wiring pattern 7. Frame ground portion 6 is electrically connected to housing 11 and grounded to the frame ground as described above.

Next, a function and effect of board-type noise filter 100 according to the first embodiment will be described. Board-type noise filter 100 includes: printed wiring board 1 having wiring pattern 7 formed thereon; common mode choke coil 4 mounted on printed wiring board 1, and including core 4a having a toroidal shape and coil 4b wound around core 4a; frame ground portion 6 fixed to printed wiring board 1 at a position overlapping with the hollow portion of common mode choke coil 4 when the toroidal shape of common mode choke coil 4 is seen in plan view, the frame ground portion being provided such that it can be grounded to the frame ground; and line bypass capacitors 2, 3, 8, 9 each mounted on printed wiring board 1, and each having a first terminal and a second terminal, the first terminal being connected to frame ground portion 6 through wiring pattern 7.

Consequently, the distance between line bypass capacitors 2, 3, 8, 9 and frame ground portion 6 can be made shorter than the distance between line bypass capacitors and an external connection terminal stand grounded to a frame ground in a conventional board-type noise filter. Accordingly, the length of wiring pattern 7 electrically connecting line bypass capacitors 2, 3, 8, 9 to frame ground portion 6 can be made shorter than the length of a wiring pattern connecting line bypass capacitors to an external connection terminal stand in a conventional board-type noise filter. As a result, degradation in noise reduction performance due to wiring inductance is suppressed in board-type noise filter 100 as compared to a conventional board-type noise filter, so that board-type noise filter 100 has high noise removal performance.

Moreover, in this manner, a parasitic capacitance can be formed between choke coils 4b, 4c of common mode choke coil 4 and fixing member 5 (or frame ground portion 6). The parasitic capacitance may serve as a line bypass capacitor, thus allowing board-type noise filter 100 to have high noise removal performance.

Furthermore, since wiring pattern 7 connects the first terminals of line bypass capacitors 2, 3, 8, 9 to frame ground portion 6, and frame ground portion 6 and housing 11 are connected to each other when printed wiring board 1 is fixed to housing 11, wiring pattern 7 can be routed more easily than in a conventional board-type noise filter including a terminal stand, thereby improving the freedom of design of the pattern of printed wiring board 1.

In board-type noise filter 100, common mode choke coil 4 and frame ground portion 6 are preferably spaced from each other by a distance equal to or greater than the shortest distance that can ensure electrical insulation. When common mode choke coil 4 and frame ground portion 6 are spaced from each other by the shortest distance that can ensure electrical insulation, a large parasitic capacitance can be formed between common mode choke coil 4 and fixing member 5 (or frame ground portion 6). The parasitic capacitance can serve as a line bypass capacitor. In this case, a multistage LC filter circuit is formed in board-type noise filter 100 because of the inductance of common mode choke coil 4 and the parasitic capacitance, thus allowing board-type noise filter 100 to have high noise reduction performance.

In board-type noise filter 100, wiring pattern 7 connecting frame ground portion 6 to the first terminals of line bypass capacitors 2, 3, 8, 9 is preferably linearly formed. In this manner, the length of wiring pattern 7 can be further reduced as compared to that of a conventional board-type noise filter. Thus, such board-type noise filter 100 has high noise removal performance.

Electronic device 200 according to the first embodiment includes board-type noise filter 100 described above. In board-type noise filter 100, printed wiring board 1 is formed with the first through hole, and frame ground portion 6 is formed with the second through hole. Electronic device 200 includes housing 11 formed with the third through hole and made of a conductive material. By tightening fixing member 5 into the first through hole, the second through hole and the third through hole with the first through hole, the second through hole and the third through hole being arranged to overlap with one another, printed wiring board 1 and housing 11 are fixed to each other, and frame ground portion 6 is grounded to the frame ground.

In this manner, high-frequency noise that occurs when electronic device 200 is operated is prevented from flowing toward load 16 by common mode choke coil 4 of board-type noise filter 100, and is bypassed to the frame ground by line bypass capacitors 2, 3, 8, 9 connected to frame ground portion 6. Accordingly, malfunction of electronic device 200 due to noise is suppressed.

For example, in electronic device 200 configured as a switching power supply, upon start of operation of switching power supply circuit 15, a switching element (for example, an insulated gate bipolar transistor (IGBT) or a field effect transistor (FET)) forming switching power supply circuit 15 repeats switching operation at an oscillation frequency in the kHz to MHz band, for example. As the amount of electric power supplied to load 16 increases, voltage/current is turned on/off at high speed, causing high-frequency noise to occur when the switching element is turned on/off. In a diode forming rectifying diode bridge 14, which has a reverse recovery time due to its characteristics, high-frequency noise occurs at the moment of on-to-off switching. The high-frequency noise thus produced is propagated to the inside or outside of electronic device 200 by means of emission or conduction. For this reason, a noise level for electronic device 200 is determined by the standard. Electronic device 200 includes board-type noise filter 100, where common mode choke coil 4 and line bypass capacitors 2, 3, 8, 9 of board-type noise filter 100 may contribute to reduction in noise level in a common mode, and across-the-line-capacitor 10 of board-type noise filter 100 may contribute to reduction in noise level in a normal mode.

Further, since printed wiring board 1 and housing 11 are fixed to each other by fixing member 5 at a central portion of common mode choke coil 4 having a large mass, the occurrence of distortion of printed wiring board 1 can be suppressed in a high vibration environment.

Further, since printed wiring board 1 and housing 11 are fixed to each other by fixing member 5 at the central portion of common mode choke coil 4, even if common mode choke coil 4 generates heat due to conduction loss, the heat can be dissipated into housing 11 through frame ground portion 6 and fixing member 5. Choke coils 4b and 4c including Cu in its constituent material increase in resistance value as the temperature increases. Thus, by suppressing the temperature increase in common mode choke coil 4, the increase in resistance value of choke coils 4b and 4c can also be suppressed, thereby suppressing reduction in noise removal performance of common mode choke coil 4 associated with the conduction loss. Although the diameter of fixing member 5 (screw diameter) may be any size, the diameter of fixing member 5 (screw diameter) is preferably large from the viewpoint of heat dissipation performance.

(Second Embodiment)

Figure 5:
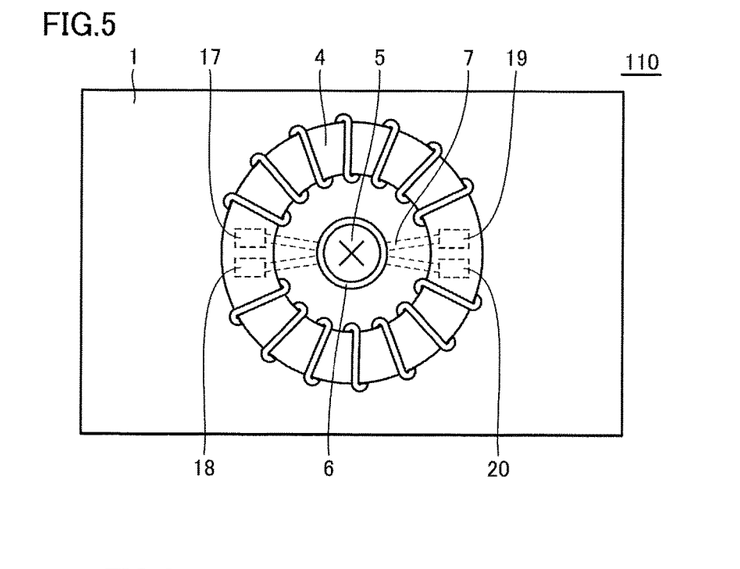
FIG. 5 is a top view for illustrating a board-type noise filter according to a second embodiment.
Figure 6:
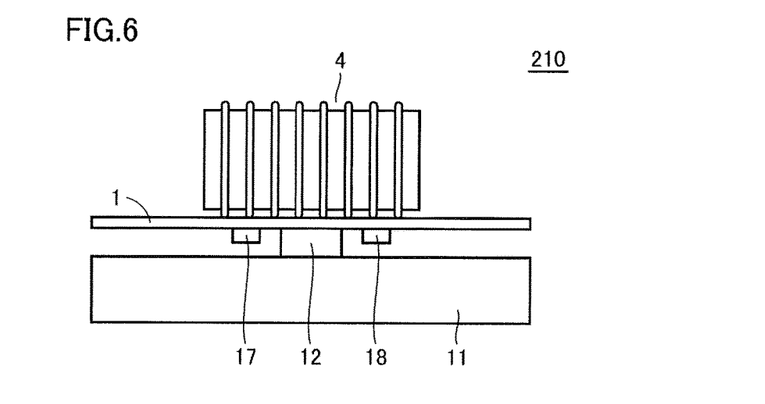
FIG. 6 is a partial side view for illustrating an electronic device including the board-type noise filter according to the second embodiment.
Figure 7:
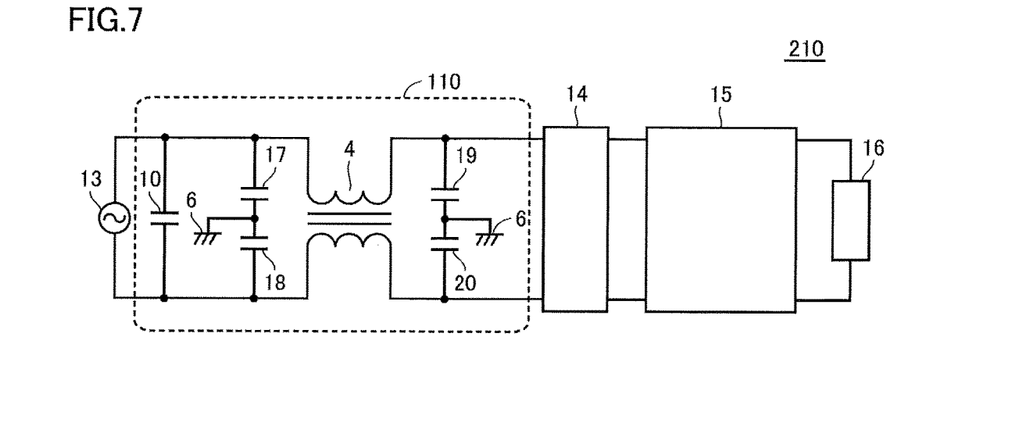
FIG. 7 is a circuit diagram of the electronic device including the board-type noise filter according to the second embodiment.

With reference now to FIGS. 5 to 7, a board-type noise filter 110 according to a second embodiment is described. Board-type noise filter 110 according to the second embodiment basically has a configuration similar to that of board-type noise filter 100 according to the first embodiment, but is different in that, instead of line bypass capacitors 2, 3, 8, 9 mounted on the side of on printed wiring board 1 at which common mode choke coil 4 is provided, line bypass capacitors 17, 18, 19, 20 are mounted on a surface of printed wiring board 1 located opposite to the surface on which common mode choke coil 4 is mounted.

Line bypass capacitors 17, 18, 19, 20 are mounted at positions at least partially overlapping with common mode choke coil 4 when the toroidal shape of common mode choke coil 4 is seen in plan view. In other words, the length of wiring pattern 7 connecting the line bypass capacitors to frame ground portion 6 is equal to or smaller than the radius of an outer circumferential circle of common mode choke coil 4. Line bypass capacitors 17, 18, 19, 20 are provided such that they are surface mountable. Preferably, line bypass capacitors 17, 18, 19, 20 are mounted at positions at least partially overlapping with the hollow portion of common mode choke coil 4 when the toroidal shape of common mode choke coil 4 is seen in plan view. In other words, preferably, the length of wiring pattern 7 is equal to or smaller than the radius of an inner circumferential circle of common mode choke coil 4.

Again in this case, in board-type noise filter 110 according to the second embodiment, the length of wiring pattern 7 can be reduced as compared to that of a conventional board-type noise filter. Thus, board-type noise filter 110 according to the second embodiment can produce a similar effect to that of board-type noise filter 100 according to the first embodiment.

Further, in board-type noise filter 110 according to the second embodiment, line bypass capacitors 17, 18, 19, 20 are mounted on the surface of printed wiring board 1 located opposite to the surface on which common mode choke coil 4 is mounted, at positions at least partially overlapping with common mode choke coil 4. Thus, in board-type noise filter 110 according to the second embodiment, the length of wiring pattern 7 can be reduced as compared to that of board-type noise filter 100 according to the first embodiment. As a result, degradation in noise removal performance due to wiring inductance is suppressed in board-type noise filter 110, so that board-type noise filter 110 has high noise removal performance.

Further, an electronic device 210 according to the second embodiment includes board-type noise filter 110 according to the second embodiment and housing 11, and printed wiring board 1 and housing 11 are fixed to each other by fixing member 5 at a central portion of common mode choke coil 4 having a large mass. Thus, electronic device 210 according to the second embodiment can produce a similar effect to that of electronic device 200 according to the first embodiment.

(Third Embodiment)

Figure 8:
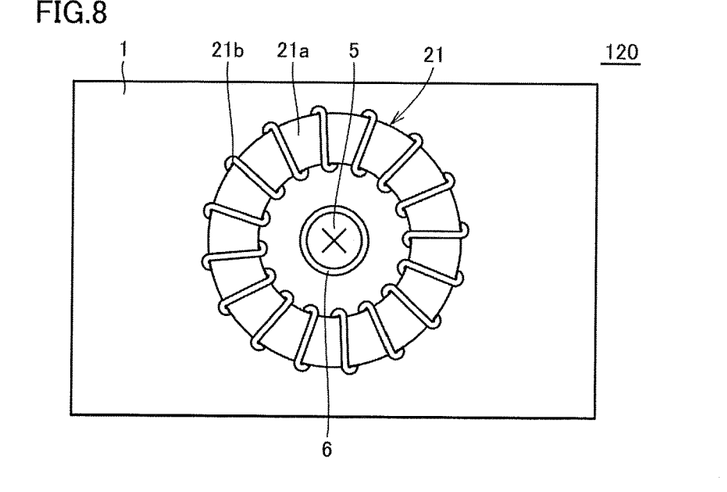
FIG. 8 is a top view for illustrating a board-type noise filter according to a third embodiment.
Figure 9:
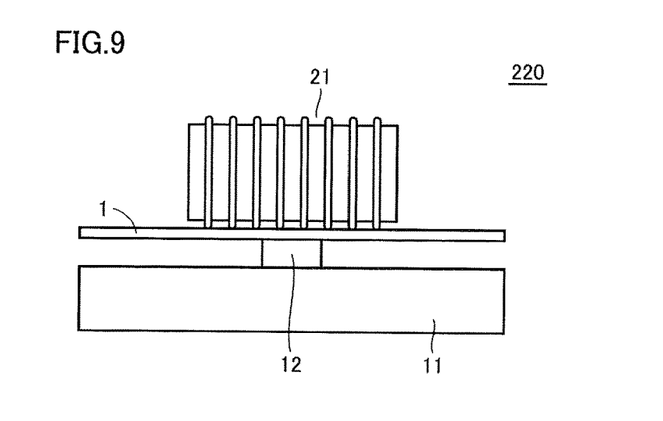
FIG. 9 is a partial side view for illustrating an electronic device including the board-type noise filter according to the third embodiment.
Figure 10:
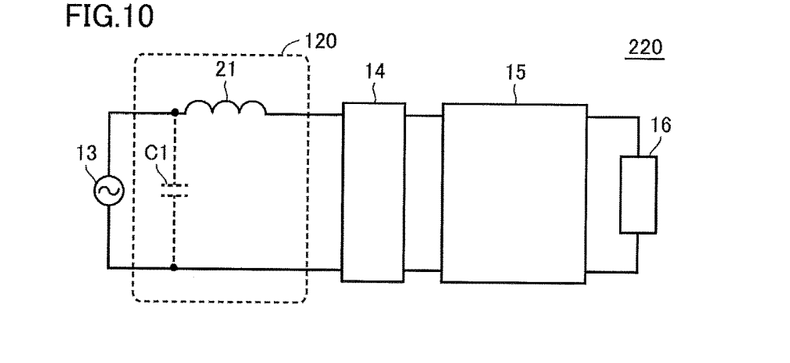
FIG. 10 is a circuit diagram of the electronic device including the board-type noise filter according to the third embodiment.

With reference now to FIGS. 8 to 10, a board-type noise filter 120 according to a third embodiment is described. Board-type noise filter 120 according to the third embodiment basically has a configuration similar to that of board-type noise filter 120 according to the first embodiment, but is different in that it is configured as a filter for normal mode noise instead of being configured as a filter for common mode noise, and that no capacitor is connected between the lines.

Board-type noise filter 120 includes a normal mode choke coil 21 instead of common mode choke coil 4. Normal mode choke coil 21 is connected to the first input terminal. Normal mode choke coil 21 includes a core 21a having a toroidal shape, and a single choke coil 21b wound around core 21a in opposite directions to each other. A material forming core 21a is ferrite, for example. Normal mode choke coil 21 is configured to have high inductance when a normal mode current flows through single choke coil 21b.

In board-type noise filter 120, printed wiring board 1 may be formed with at least the first through hole into which fixing member 5 can be inserted. The first through hole into which fixing member 5 is to be inserted is formed on printed wiring board 1 at a position overlapping with a hollow portion of normal mode choke coil 21.

Fixing member 5 and frame ground portion 6 (electrode portion) may include configurations similar to those of fixing member 5 and frame ground portion 6 in board-type noise filter 100 according to the first embodiment, respectively. That is, frame ground portion 6 is formed with the second through hole into which fixing member 5 can be inserted. By inserting and tightening fixing member 5 into the first through hole, the second through hole and the third through hole formed in housing 11 described above, frame ground portion 6 and housing 11 are electrically connected to each other with fixing member 5 interposed therebetween. Here, fixing member 5 is provided such that, when fixed to printed wiring board 1, it is spaced from choke coil 21b of normal mode choke coil 21 by a distance equal to or greater than an insulating distance determined by the standard. Frame ground portion 6 is connected to the second input terminal.

Consequently, fixing member 5 and frame ground portion 6 are grounded to the frame ground, and between choke coil 21b of normal mode choke coil 21 and fixing member 5 (or frame ground portion 6), a parasitic capacitance (dielectric constant×area/distance between conductors) inversely proportional to the distance between them (distance between conductors) is formed. The parasitic capacitance may serve as a line bypass capacitor in a filter circuit for normal mode noise. That is, in board-type noise filter 120, a multistage LC filter circuit is formed by the parasitic capacitance and the winding inductance of normal mode choke coil 21. As a result, board-type noise filter 120 has noise removal performance without using a line bypass capacitor. In addition, by selecting an appropriate outer diameter of fixing member 5 so as to set the above-described distance between conductors to a shortest distance that satisfies the insulating distance determined by the standard, for example, board-type noise filter 120 can have higher noise removal performance than that of a conventional noise filter.

In board-type noise filters 100, 110 and 120 according to the first to third embodiments, fixing member 5 and frame ground portion 6 may be connected to each other through a buffer member (such as a washer) having a greater outer diameter than that of fixing member 5. The buffer member may be made of any conductive material. The buffer member is a washer, for example.

Frame ground portion 6 may be formed integrally with printed wiring board 1, or may be formed separately from printed wiring board 1 and fixed to printed wiring board 1 by fixing member 5.

In board-type noise filter 100 or 110 according to the first or second embodiment, a thermal via (not shown) having the same potential as frame ground portion 6 and wiring pattern 7 may be formed on printed wiring board 1 at a position overlapping with the hollow portion of common mode choke coil 4. In this case, the thermal via is connected to the first through hole into which fixing member 5 is to be inserted. In this manner, even if common mode choke coil 4 generates heat due to conduction loss, the heat can be dissipated into housing 11 through the thermal via and fixing member 5.

In electronic devices 200, 210 and 220 according to the first to third embodiments, rectifying diode bridge 14, switching power supply circuit 15 and load 16 may be formed on printed wiring board 1. Alternatively, rectifying diode bridge 14, switching power supply circuit 15 and a connector or a terminal stand may be formed on printed wiring board 1, and load 16 not formed on printed wiring board 1 may be connected to switching power supply circuit 15 and the like through the connector or the terminal stand.

Although fixing member 5 is configured as a screw in electronic devices 200, 210 and 220 according to the first to third embodiments, this is not limiting. Fixing member 5 may have any configuration as long as it can be inserted into the first through hole, the second through hole and the third through hole, and as long as it can ground frame ground portion 6 to the frame ground of electronic device 200. For example, fixing member 5 may be configured as a male spacer made of a metal material.

Although the embodiments of the present invention have been described as above, the embodiments described above can be modified in various ways. In addition, the scope of the present invention is not limited to the embodiments described above. The scope of the present invention is defined by the terms of the claims, and is intended to include any modifications within the scope and meaning equivalent to the terms of the claims.

INDUSTRIAL APPLICABILITY

The present invention is applied particularly advantageously to a noise filter including a common mode choke coil or a normal mode choke coil.

REFERENCE SIGNS LIST

1 printed wiring board; 2, 3, 8, 9, 17, 18, 19, 20 line bypass capacitor; 4 common mode choke coil; 4a, 21a core; 4b, 4c, 21b choke coil; 5 fixing member; 6 frame ground portion (electrode portion); 7 wiring pattern; 10 across-the-line-capacitor; 11 housing; 12 support strut; 13 external power supply; 14 rectifying diode bridge; 15 switching power supply circuit; 16 load; 21 normal mode choke coil; 100, 110, 120 board-type noise filter; 200, 210 220 electronic device.

The invention claimed is:

1. A board-type noise filter comprising:
    a printed wiring board having a wiring pattern formed thereon;
    a common mode choke coil mounted on the printed wiring board, and including a core having a toroidal shape and a coil wound around the core;
    a frame ground portion fixed to the printed wiring board at a position overlapping with a hollow portion of the common mode choke coil when the toroidal shape of the common mode choke coil is seen in a plan view, the frame ground portion being connectable to a frame ground; and
    a bypass capacitor mounted on the printed wiring board, the bypass capacitor having a first terminal and a second terminal, the first terminal being connected to the frame ground portion through the wiring pattern,
    the bypass capacitor is arranged around the common mode choke coil on the printed wiring board,
    the common mode choke coil and the frame ground portion are spaced from each other by a distance equal to or greater than a shortest distance that can ensure electrical insulation,
    a length of the wiring pattern is equal to or smaller than a diameter of the common mode choke coil, the bypass capacitor being spaced from the frame ground portion according to the length of the wiring pattern.

2. An electronic device comprising the board-type noise filter according to claim 1, wherein
    in the board-type noise filter, the printed wiring board is formed with a first through hole, and the frame ground portion is formed with a second through hole,
    the electronic device comprises a housing formed with a third through hole and made of a conductive material, and
    by tightening the fixing member into the first through hole, the second through hole and the third through hole with the first through hole, the second through hole and the third through hole being arranged to overlap with one another, the printed wiring board and the housing are fixed to each other, and the frame ground portion is grounded to the frame ground.

3. The board-type noise filter according to claim 1, wherein
    the wiring pattern connecting the frame ground portion to the first terminal of the bypass capacitor is linearly formed.

4. The board-type noise filter according to claim 1, wherein
    the bypass capacitor is mounted on a surface of the printed wiring board located opposite to a surface on which the common mode choke coil is mounted, at a position at least partially overlapping with the common mode choke coil.

5. A board-type noise filter having a first input terminal and a second input terminal, the board-type noise filter comprising:
    a printed wiring board having a wiring pattern formed thereon;
    a normal mode choke coil mounted on the printed wiring board, connected to the first input terminal, and including a core having a toroidal shape and a coil wound around the core; and
    an electrode portion fixed to the printed wiring board at a position overlapping with a hollow portion of the normal mode choke coil when the toroidal shape of the normal mode choke coil is seen in a plan view, and connected to the second input terminal,
    the normal mode choke coil and the electrode portion being spaced from each other.

* * * * *